United States Patent [19]
Roylance

[11] Patent Number: 5,574,447
[45] Date of Patent: Nov. 12, 1996

[54] METHOD AND APPARATUS FOR MODIFYING CHARACTERS ENTERED ON A COMPUTER KEYBOARD

[75] Inventor: William H. Roylance, Salt Lake City, Utah

[73] Assignee: Mallinckrodt & Mallinckrodt, Salt Lake City, Utah; a part interest

[21] Appl. No.: 506,241

[22] Filed: Jul. 24, 1995

[51] Int. Cl.[6] .......................................... B41J 5/00
[52] U.S. Cl. ............................ 341/22; 400/477; 345/25; 345/172
[58] Field of Search .......................... 341/22; 400/472, 400/447; 345/145, 25, 172, 141, 169; 395/700

[56] References Cited

U.S. PATENT DOCUMENTS

| | | | |
|---|---|---|---|
| 5,007,008 | 4/1991 | Beers | 341/22 |
| 5,087,910 | 2/1992 | Guyot-Sionnest | 341/22 |
| 5,288,158 | 2/1994 | Matias | 400/472 |
| 5,341,133 | 8/1994 | Savoy | 341/22 |
| 5,367,298 | 11/1994 | Axthelm | 341/22 |
| 5,387,042 | 2/1995 | Brown | 400/447 |

*Primary Examiner*—Jeffery Hofsass
*Assistant Examiner*—Albert K. Wong
*Attorney, Agent, or Firm*—Mallinckrodt & Mallinckrodt

[57] ABSTRACT

A keyboard for use with a computer has an array of keys including a space key and modifiable keys with apparatus for detecting when keys are pressed and generating a key code corresponding to keys that are pressed, a buffer capable of holding the key code of a key, a state register having three states including a state indicating when the first key code of a word is in the buffer. The keyboard also has apparatus for comparing a key code in the buffer to a second key code and for generating a modified key code when a match is found, and apparatus for sending the key code to the host computer, the key code sent being the modified key code when the first key code of a word is in the buffer and the key code in the buffer matches the second key code of the word.

23 Claims, 3 Drawing Sheets

METHOD AND APPARATUS FOR MODIFYING CHARACTERS ENTERED ON A COMPUTER KEYBOARD

BACKGROUND OF THE INVENTION

1. Field of the Invention

The invention relates to methods and apparatus for entry of characters on a computer keyboard, and specifically relates to methods and apparatus for selecting among various cases, or functions, controlled by individual keys.

2. The State of the Art

Typical manual typewriters have a multiplicity of type bars, each of which is mechanically linked to a key. Keys and type bars were made to do double duty by forming two characters on each type bar. A "shift" key then would reposition the entire array of type bars to determine whether the first or the second character on the type bars would be imprinted on the paper. The array of type bars was repositioned into the normal position by a spring when the shift key was released. Typing an upper-case key therefore required that the shift key first be depressed and second that the desired letter key be pressed while the shift key was still depressed. A separate "Shift Lock" key was often provided that would lock the type bars in the shifted position, and maintain them in that condition until the released by a separate act of the user.

Many features of todays computer keyboards are traceable to the characteristics of manual typewriters. Among these features is the QWERTY layout, and the requirement that a "shift" key be pressed and held while a character key is struck to generate an upper case character. Many keyboards also have one or more "Control" "Function" or "Alt" keys that change the function or character of a simultaneously struck key in a manner similar to the operation of the "Shift" key. The "Control, " "Function," "Alt," and "Shift" keys are all key-modifier keys, while the key having a function that is altered by the key-modifier key may be referred to as the modifiable key.

Generally, the key modifier keys are located at the sides of a keyboard where they are generally struck with the little finger. There are many people with limited hand mobility who find that operating these keys with the little finger is awkward. Additionally, the placement of key-modifier keys on many keyboards is such that simultaneous operation of key modifier keys and modifiable keys is difficult for those who have limited hand mobility or who type with one hand or with a mouthstick.

Northgate has sold a keyboard having an operating mode in which key-modifier keys alter the function of the first modifiable key struck following activation of the key-modifier key. The key-modifier is then automatically cleared such that the function of the second following modifiable key is not altered by the key-modifier key. The Northgate keyboard has the key-modifier keys located in the conventional locations, and has an operating mode in which the key-modifier keys behave conventionally.

Generally, keyboard keys respond only to motion or pressure applied to the key in a direction perpendicular to the plane of the keyboard. U.S. Pat. No. 4,680,577, issued to Straayer, et al., in 1986, describes a key having sensors that detect forces applied to the key in additional directions, or sideways, directions that are not perpendicular to the plane of the keyboard. Signals corresponding to the sideways forces detected by the key of the Straayer patent are used to manipulate the position of a cursor in place of a mouse.

The backspace key on a typical computer keyboard, such as the IBM 101-key layout, is not placed where it can be reached easily without requiring that the user remove his/her hands from their home positions on the keyboard.

A typical keyboard comprises an array of keys together with means for detecting a key that is pressed, and for identifying the specific key that is pressed. The means for detecting and identifying a key that is pressed may take many forms. On antique teletypes, detecting and identifying key presses is done mechanically. On many modern keyboards, key presses activate a switch associated with each key, the array of keys being scanned to detect and identify the particular key being pressed. Membrane switches are often used in keyboards. Switches are not necessary, some keyboards have magnets in the keys that, when the key is pressed, activate Hall-effect magnetic sensors associated with each key. Alternatively, key presses may be detected by devices that change resistance when under pressure.

Modern keyboards utilize an electronic device for scanning the array of keys to detect when a key is pressed and for generating a key code specific to the key pressed. This device may, but need not, be located on the same circuit board as the array of keys. This device may comprise dedicated electronic circuitry or may incorporate a small microprocessor programmed to scan the array. The microprocessor may also translate the key code into a standard encoded format and communicate, often serially, the translated code to a remote device.

Many electronic devices for scanning the array of keys operate by driving a first voltage on a row line, a line common to a plurality of key switches. There are usually more than one row line, the remaining row lines being resistively connected to a second voltage, as is a plurality of column lines. Each key switch in a row connects to a different column line. When a key switch is activated, and the associated row line is driven to the first voltage, the first voltage is coupled onto and may be sensed on the associated column line. Each key is therefore defined by the intersection of a row and a column. The keyboard is scanned by successively driving the first voltage on each of the row lines, while monitoring the column lines. This technique permits the keyboard scanning device to correctly identify at least two simultaneously active keys, possibly more depending upon their locations in the key array.

Electronically scanned keyboards also may have a diode in series with each of the key switches. The diodes allow the keyboard scanning device to correctly identify all active, or pressed, keys even if several keys are pressed simultaneously.

SUMMARY OF THE INVENTION

I have recognized that modern electronics offers the possibility of selecting among alternative functions of keys in ways not practical on a manual typewriter. Further, I have recognized that, with a few exceptions such as "Aardvark," English language words do not begin with a double letter.

My keyboard therefore recognizes double keystrokes at the beginning of words. Whenever a word separator, such as an 'enter,' 'space' or 'return' key is followed by a double letter, that double letter is replaced by a single upper-case letter of the same character as the doubled letter. The double letter is therefore recognized as a key-modifier followed by a single letter.

I have also recognized that numbers frequently begin with a duplicated digit. In my keyboard's normal mode of operation, double initial digits do not generate the typographic character normally associated with the combination of the shift key and the digit key.

My keyboard is also fitted with a space key having sensors to detect sideways forces applied to it by a user. When a user presses the space key in a first direction, a first key-modifier function, the 'shift' function, is activated. When the space key is pressed in a second direction, a second key-modifier function is activated. The selected key-modifier function is active for the first succeeding modifiable key pressed, and is cleared prior to the second succeeding modifiable key pressed. The key-modifier function will be cleared in two seconds if no modifiable key is pressed.

In addition to recognizing double initial characters of words and sideways pressures on the spacebar as key-modifiers, my keyboard has key-modifier keys so that it may be used by users accustomed to prior art keyboards, and to permit generation of the typographic characters formed by shifting digit keys.

I have recognized that users may accidentally strike a key-modifier key. The key-modifier keys of my keyboard, including the shift key, need not be struck simultaneously with the modifiable key. The first modifiable key pressed within two seconds after a key-modifier key is activated is modified in accordance with the key-modifier. The two second timeout permits a user to correct a mistakenly struck key-modifier key by pausing in the user's typing.

Alternatively, a word processor having a keyboard embodying my invention may compare an entire word as entered by the user with the words in a dictionary of words that begin with a double letter. Those words having doubled initial letters that do not appear in the dictionary have their doubled initial letter replaced by an upper case letter.

BRIEF DESCRIPTION OF THE DRAWINGS

The best mode presently contemplated for carrying out the invention is illustrated in the accompanying drawings, in which.

DETAILED DESCRIPTION OF THE INVENTION

Figure 1:
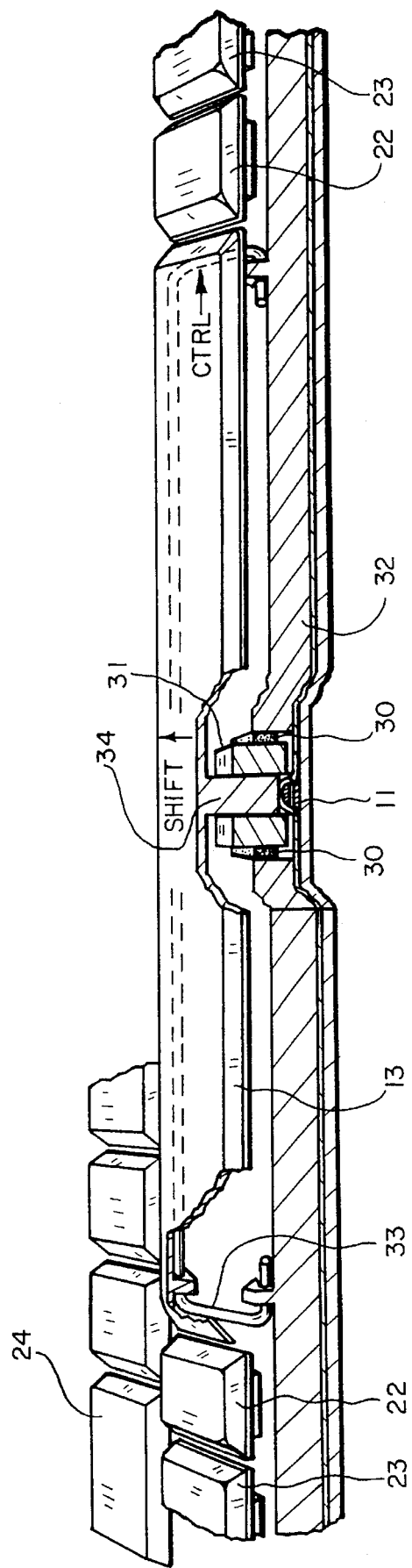
FIG. 1 is a fragmentary perspective view of a keyboard according to the present invention, cut away to show the load cells that sense sideways pressures on the spacebar.

My keyboard comprises an array of keys 10, each actuating a switch, together with a microcontroller 12. The array of keys has a standard "QWERTY" layout, and includes a 'space' key 13 as shown in FIG. 1. Each key of the array is associated with a membrane switch, such as the space key switch 14, and a diode.

Figure 2:
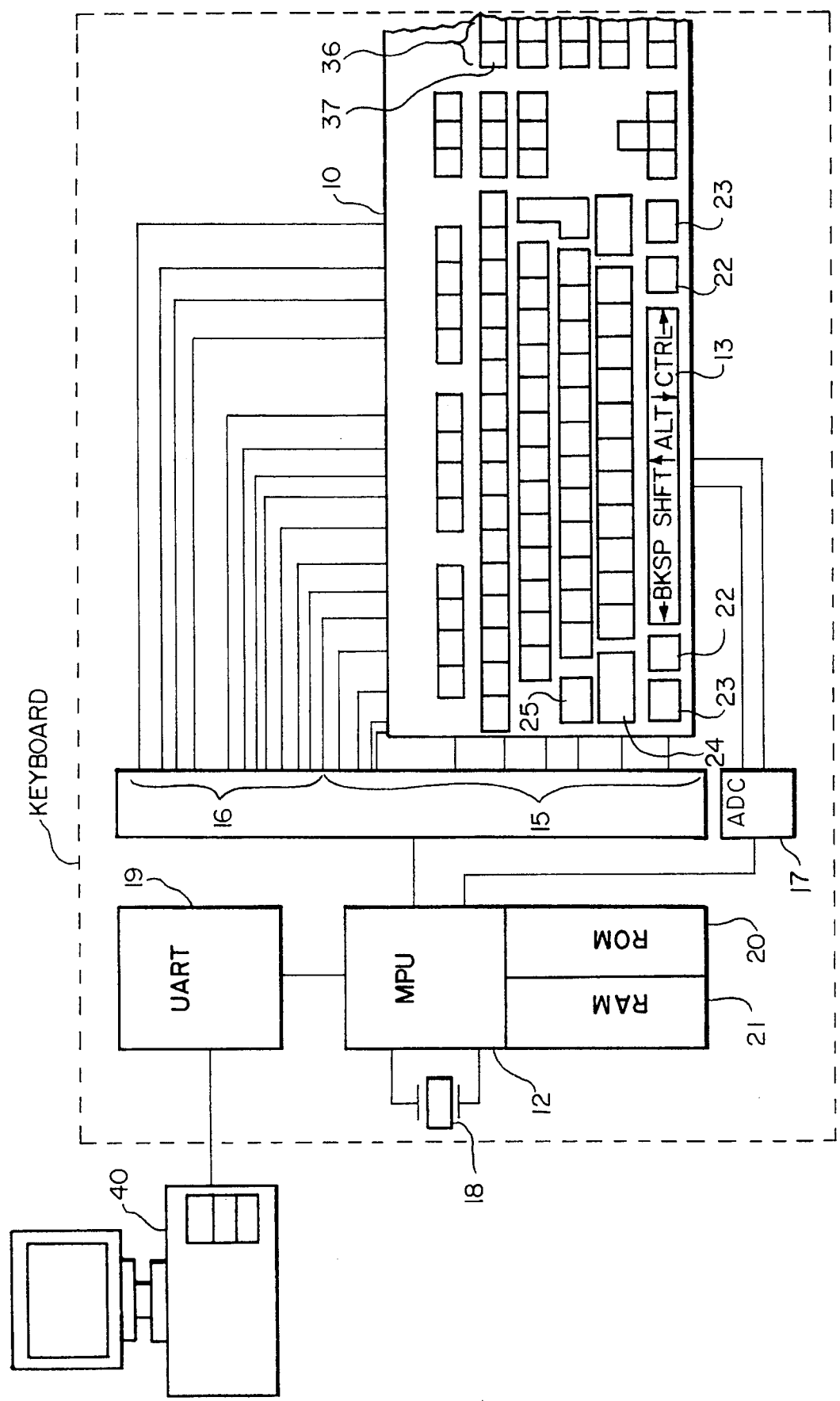
FIG. 2, a block diagram of a keyboard according to the present invention, shown connected to a computer system.

The keyboard is scanned by the microcontroller 12 as shown in FIG. 2. The microcontroller is equipped with eleven scan output row driver lines 15, one LED output driver, twelve scan inputs 16, four analog-to-digital (A/D) convertor 17 input lines, a crystal oscillator 18 and a Universal Asynchronous Receiver Transmitter (UART) 19 circuit. The microcontroller also has a program memory ROM 20 and some RAM 21. The microcontroller 12 may be a member of the Intel 8051 or Motorolo 68HC05 families.

The membrane switch and diode for each key are connected in series between a scan output row driver line 15 and a scan input column line 16, such that current will flow between the driver line and input line when the switch is closed, the driver line is at a low voltage, and the input line is at a higher voltage. Each input line is connected through a pullup resistor (not shown) to a power supply voltage source. 101 keys are provided, having a layout similar to the IBM-PC standard 101 key layout, with a space key 13, a pair of ALT key-modifier keys 22, a pair of CTRL key-modifier keys 23, a pair of SHIFT key-modifier keys 24, a CAPS-LOCK key-modifier key 25, a NUM-LOCK key modifier key (not shown), and an assortment of modifiable keys.

The space key 13 of the keyboard is fitted with four pressure sensors, or load cells 30 (two of which are shown), for detecting forces in the plane of the keyboard array, the plane perpendicular to the normal direction of motion of a space key. These sensors are interposed between a key guide 31 and a mount 32 that is attached to the circuit board 32 of the keyboard. Mount 32 is cast as one piece with key guides for the remaining keys of the keyboard. A stabilizer rod 33 is provided to prevent jamming of the key pin 34 in the slot of the key guide 31 when the space key is struck to a side of its center. Sensors or load cells 30 detect separately forces applied to the space key 13 in the forward direction toward the alphabetic keys of the keyboard, forces toward the left side of the key array where the CAPS-LOCK key 25 is located, right forces in the direction toward the numeric entry pad 36, and reverse forces toward the user. Signals from these load cells 30 are amplified and fed to the A/D convertor 17 of the microcontroller.

The microcontroller has a ROM 20 containing a control program that directs the operation of the microcontroller. The microcontroller 12 scans the key array 10 every 25 milliseconds, and debounces the switch array in the manner known in the art. The row number and column number of each active key is translated to a standard key code through a lookup table. The microcontroller 12 also samples the A/D convertor 17 inputs, and compares the forces applied to each of the load cells with a force threshold.

Whenever the microcontroller 12 determines that a key has been pressed, the microcontroller determines whether the key is a key-modifier key, such as a shift key 24, CTRL key 23, ALT key 22, or NUM lock key 37. If the key is a key-modifier key, the microcontroller sets an associated modifier-active flag and initializes an associated recent-modifier counter in its memory to 80. Whenever the key-modifier key is released, the modifier-active flag is cleared. The recent modifier counter is then decremented once every 25 milliseconds if the modifier-active flag is not set, until it reaches, and remains at, zero.

Whenever the microcontroller determines that a modifiable key has been pressed, the modifier-active flag and recent modifier counter for each available modifier are checked. If the modifier-active is set, or the recent-modifier counter is greater than zero, the recent modifier counter is cleared and the key code of the modifiable key is modified to produce the code for the desired shifted, ALT, or CTRL character. Modification may be accomplished by performing logical operations upon the key code, or by looking up the modified code in a table indexed by the modifiable key code.

In an alternative preferred embodiment of the present invention, force applied to the space key in the direction towards the user generates a modification that replaces the key code with an entire string of key codes representing common words instead of the ALT function generated by the illustrated embodiment. In this alternative embodiment, pressure on the space bar towards the user causes the "T" key to generate the string "the", the "U" key to generate the string "you", the "A" key to generate the string "at", the "O" key to generate the string "of" and the "N" key to generate the string "and"

After any modifications to the key code are complete, the key code or string is placed in a first-in, first-out (FIFO) queue in the microcontroller RAM 21.

Whenever the microcontroller finds a space key has been pressed, the microcontroller checks the modifiers, and if a modifier is active or a recent-modifier counter is greater than zero, the key code for the space is modified and placed in the queue. If no modifier is active, a space-desired flag is set, a space timer is cleared and started, but no code is placed in the queue.

If the microcontroller 12 finds that one of the four force sensors attached to the space key indicates a force greater than the associated threshold force, the space-desired flag is cleared as the microcontroller 12 presumes that an alternative function of the space key is desired. If the sensors detect that the space key has been pressed forward, backwards, or to the right, appropriate key-modifier active flags and recent-modifier counters are started as if a key-modifier key had been pressed. The modifier active flag, and recent-modifier counter, set when the space key has been pressed forward is logically OR'ed with the SHIFT key-modifier flag and recent-modifier counter when modifiable keys are pressed to produce similar function to pressing the SHIFT key; similarly pressing the shift key to the right produces similar function to the CTRL key, and backwards the similar function to the ALT key.

If the sensors indicate that the space key has been forced to the left, a backspace code is entered into the queue and a backspace timer is started. If the backspace timer reaches one-half second, backspace codes are entered into the queue every tenth of a second thereafter until the pressure is removed from the space key. This autorepeat function does not occur for the SHIFT, CTRL, and ALT functions of the space key.

Should the space timer reach one half second with the space desired flag still set, the microcontroller will presume that a space character is desired. A space code will be entered into the queue, and, should the timer reach three fourths of a second, space codes will be entered into the queue every tenth of a second thereafter to perform an autorepeat function.

Whenever the microcontroller senses that the space key has been released, the space-desired flag in the microcontroller memory is tested. If the space-desired flag is set, a space code is entered into the queue.

Figure 3:
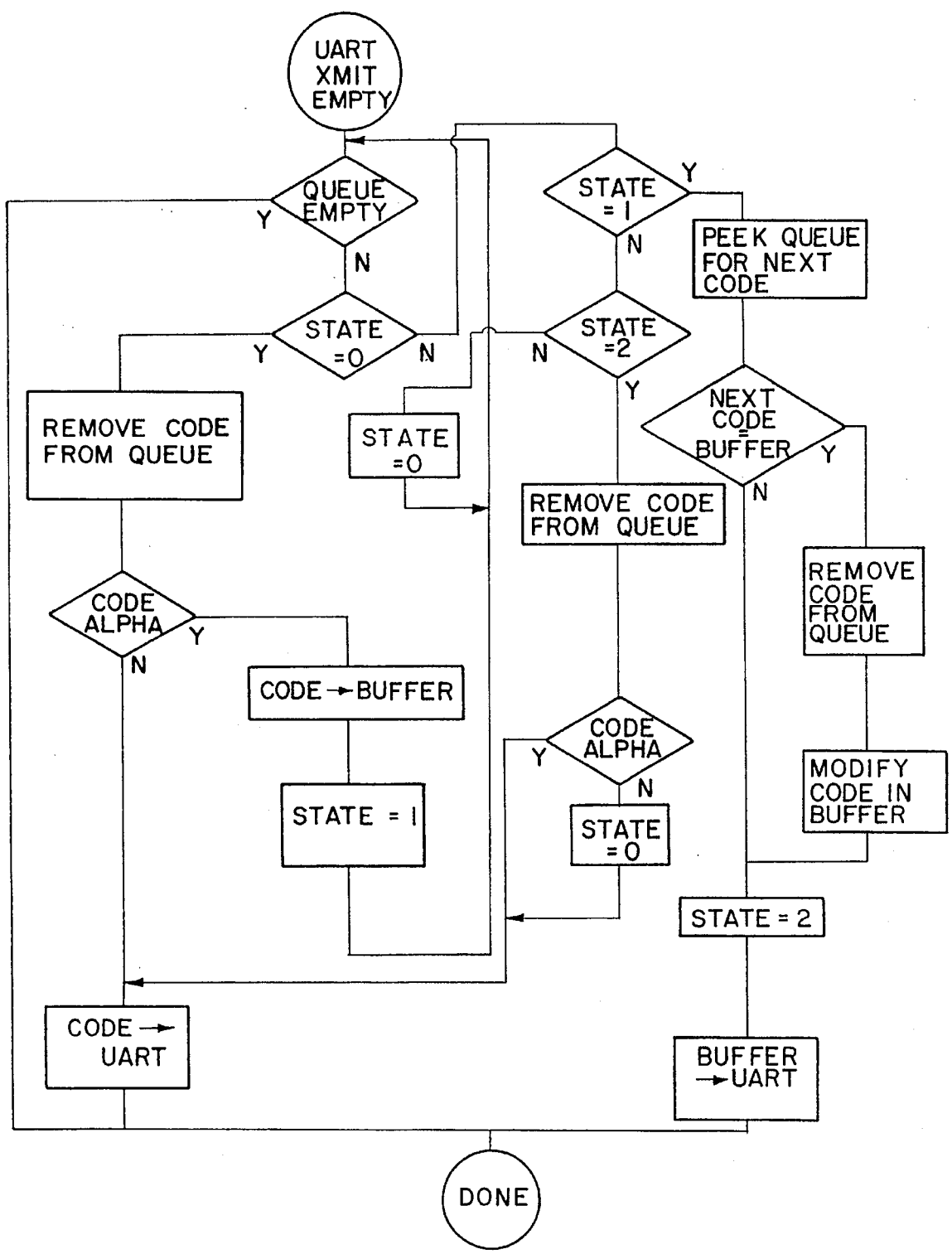
FIG. 3, a flow chart of the portion of the keyboard microcontroller code that recognizes double initial characters and replaces them with modified characters.

Whenever codes are present in the queue, and the UART is ready to send a code to the host computer, the microcontroller removes a code from the queue. The code is processed according to the sequence portrayed in flowchart form in FIG. 3. This sequence recognizes if the first two codes processed after a word separator character, such as a space, are identical lower-case alphabetic characters and replaces the two identical lower-case alphabetic characters with a single corresponding upper-case character.

The sequence is entered every 25 milliseconds if a transmit buffer of the UART is empty. If the queue is empty, no further processing takes place. If a state register is in state 0, indicating that the last key code processed was not an alphabetic character, the key code on the queue is removed from the queue and tested to determine if it is an alphabetic character. Non-alphabetic character key codes are placed into the UART transmit buffer, while any alphabetic character is placed in a buffer in the microcontroller's memory, and the state register set to state 1.

If the state register is 1, the next pending key code on the queue is compared to the key code in the buffer. If a match is found, the key code is removed from the queue, the buffer contents are modified to form the corresponding upper-case character key code, the state register is set to 2, and the buffer contents are sent to the UART transmit buffer. If no match is found, the state register is set to 2 and the unmodified buffer contents are sent to the UART transmit buffer.

If the state register is 2, the next key code is removed from the queue and tested to determine if it is the key code of an alphabetic character. If the key code is a non-alphabetic character, the state register is set to 0. The key code is then placed in the transmit buffer of the UART.

Not shown in the flowchart (FIG. 3) is a timeout function that, in state 1, transmits the code in the buffer to the host and sets the state to 2 if the queue remains empty for more than one second. Also not shown is a feature whereby if a key code processed while in state 0 is the key code of an upper-case alphabetic character, the key code is sent directly to the transmit buffer of the UART and the state register is set to 2.

When ASCII character coding is used as a key code, transformation from lower-case to upper-case requires alteration of a single bit in the key code, modification of the key code into the upper-case form requires a simple logical operation on the key code. Alternatively, key codes may be translated by looking up a modified key code in a table, such as a table in the ROM 20 of the microcontroller 12. The processed code is then transmitted to the host computer 40 via the UART 19.

The invention as here described utilizes a standard "QWERTY" key layout, the invention is also applicable to other arrangements of keys, including the DVORAK key layout. Similarly, while the sequence of operations occurring when a key is pressed has been described with reference to a microcontroller and memory locations therein, with codes compared in the ALU of the microcontroller, the same operations may be performed in dedicated electronic hardware wherein a register is equivalent to a memory location in the microcontroller, and comparison of codes is performed in a hardware comparator. Further, the keyboard has been described as using a membrane switch, the invention is applicable to keyboards constructed with other switch types, including carbon pill and Hall effect devices.

While the pressure sensors for detecting sideways forces applied to the space key have been described as load cells, other forms of sensors will also function with the present invention. Suitable sensors may include piezoelectric elements that generate voltage when pressure is applied, strain gages that change resistance when deformed, and carbon elements that change resistance under compression. The sensors may also take the form of a pressure sensitive switch, where comparison of sideways forces with the thresholds is performed mechanically.

While the presently preferred embodiment impliments four auxiliary functions through sideways forces applied to the spacebar, the technique can be readily extended to additional auxiliary functions through detecting combinations of forces in the plane perpendicular to the direction of normal key movement. In an alternative embodiment of the present invention, when the space key is forced in a diagonal direction both away from the user and towards the numeric keypad, the microcontroller clears its key-modifier counters and generates an string of key codes such that a common word processor switches to the insert mode. Similarly, force on the diagonal away from the user and away from the numeric keypad causes the microcontroller to generate a string of key codes such that the same common word processor switches to the typeover mode.

The keyboard is described in the context of a keyboard for use with a computer. The keyboard is not limited to use with a computer; the keyboard may be used with, or be a part of, an electronic typewriter or electronic word processor.

The microcontroller is described as incorporating a UART circuit for transmitting a code corresponding to activated keys to the host computer. This function can be performed in software on those low cost microcontrollers that do not have a hardware UART function. Similarly, the multi-bit key code can be transferred to the host computer through a parallel port over a plurality of lines instead of serially.

In an alternative embodiment, recognition of double initial alphabetic characters and substitution of capital letters is done in the computer. In this embodiment, a Terminate and Stay Resident (TSR) utility intercepts the character stream from the keyboard, identifies the initial characters of a word, capitalizes the initial character of a word when the two initial characters are determined to be the same by a comparison in the ALU of the computer, and passes the modified character stream on to the applications program running on the computer. This recognition could alternatively be done by the BIOS program, the system software, or a keyboard processing module of a word processing program.

Whereas this invention is here illustrated and described with reference to embodiments thereof presently contemplated as the best mode of carrying out such invention in actual practice, it is to be understood that various changes may be made in adapting the invention to different embodiments without departing from the broader inventive concepts disclosed herein and comprehended by the claims that follow.

I claim:

1. A keyboard for use with a host computer comprising:

an array of keys including a space key and a plurality of modifiable keys;

apparatus for detecting when keys of the key array are pressed and for generating a key code corresponding to keys that are pressed;

a buffer capable of holding the key code of a key;

a state register having a first state indicating when the first key code of a word is in the buffer;

means for comparing a key code in the buffer to a second key code;

means for generating a modified key code;

means for sending key codes to the host computer, the means for sending transmitting the modified key code when the state register is in the first state and the key code in the buffer matches the second key code of the word, and when the state register is in the first state and the key code in the buffer does not match the second key code of the word the means for sending transmitting key codes sent comprise a sequence comprising the key code in the buffer and the second key code.

2. The keyboard of claim 1 further comprising:

means for detecting when pressure is applied to the space key in at least one sideways direction; and means for modifying a key code if pressure is applied to the space key in the at least one sideways direction.

3. The keyboard of claim 1 further comprising means for detecting when pressure is applied to the space key in at least one sideways direction; and means for generating a predetermined key code of a non-space character when the pressure is applied to the space key in the at least one sideways direction.

4. The keyboard of claim 3, further comprising:

means for detecting when pressure is applied to the space key in at least one additional sideways direction; and means for modifying the key code if pressure is applied to the space key in the at least one additional sideways direction.

5. The keyboard of claim 4 wherein the predetermined key code of a non-space character is the key code of a backspace character, and the means for modifying the key code if pressure is applied to the space key in the at least one additional sideways direction performs the modification function of a SHIFT key.

6. The keyboard of claim 5, wherein the array of keys includes key modifier keys and further comprising:

means for modifying the key code of a modifiable key that is pressed within a timeout interval after detection of a pressed key modifier key.

7. A computer system comprising:

a computer;

an array of keys including a space key and a plurality of modifiable keys;

means for detecting when a key of the array of keys is pressed and means for generating a key code corresponding to the key that is pressed;

a state register;

means for identifying key codes corresponding to word separator characters and for setting the state register to a first state upon identifying a word separator key code;

a buffer capable of holding the key code of a first key of a word, and means for setting the state register to a second state upon identifying the first key of a word;

means for comparing the key code of a second key of a word to a key code contained in the buffer, and for forming a modified key code and advancing the state register to a third state when the key code in the buffer matches the key code of the second key and the state register is in the second state; and wherein provisions are made for entering data as keystroke data into a program running on the computer, the data comprising key codes from the buffer and the key code of the second key when the key code in the buffer does not match the key code of the second key and the state register is in the second state, and the data comprising the modified key code when the key code in the buffer matches the key code of the second key and the state register is in the second state.

8. The computer system of claim 7 further comprising:

apparatus for detecting when pressure is applied to the space key in at least one sideways direction; and means for modifying a key code if pressure is applied to the space key in the at least one sideways direction.

9. The computer system of claim 7 further comprising means for detecting when pressure is applied to the space key in at least one sideways direction; and means for generating a predetermined key code of a non-space character when the pressure is applied to the space key in the at least one sideways direction.

10. The computer system of claim 9, further comprising:

means for detecting when pressure is applied to the space key in at least one additional sideways direction; and means for modifying the key code if pressure is applied to the space key in the at least one additional sideways direction.

11. The computer system of claim 10 wherein the predetermined key code of a non-space character is the key code of a backspace character, and the means for modifying the key code if pressure is applied to the space key in the at least one additional sideways direction performs the modification function of a SHIFT key.

12. The computer system of claim 8, wherein the array of keys includes key modifier keys and further comprising:

means for modifying the key code of a modifiable key that is pressed within a timeout interval after detection of a pressed key modifier key.

13. A keyboard comprising:

an array of keys including a space key and a plurality of character keys;

means for detecting when a key of the array of keys is pressed and means for generating a key code corresponding to the key that is pressed;

means for detecting when pressure is applied to the space key in at least one sideways direction;

means for modifying the key code if pressure is applied to the space key in the at least one sideways direction.

14. The keyboard of claim 13, further comprising:

means for detecting when pressure is applied to the space key in at least one additional sideways direction; and means for generating a key code of a predetermined non-space character when the pressure is applied to the space key in the at least one additional sideways direction.

15. The keyboard of claim 13, wherein the array of keys includes key modifier keys and further comprising:

means for modifying the key code of a modifiable key that is pressed within a timeout interval after detection of a pressed key modifier key.

16. The keyboard of claim 14 wherein the key code of a predetermined non-space character is the key code of a backspace character, and the means for modifying the key code if pressure is applied to the space key in the at least one additional sideways direction performs the modification function of a SHIFT key.

17. The keyboard of claim 13 further comprising means for detecting when pressure is applied to the space key in a second sideways direction perpendicular to the first sideways direction; and means for generating a macro function when pressure is applied to the space key in the second sideways direction in a plane perpendicular to a direction of normal key movement.

18. The keyboard of claim 13 wherein the means for modifying the key code is capable of generating a string of keycodes corresponding to at least one common word of at least two characters.

19. The keyboard of claim 18 wherein the at least one common word of at least two characters includes at least two words selected from the group consisting of "the", "that", "and", "to", "of", "is", and "in".

20. The keyboard of claim 1 wherein the means for generating a modified key code is capable of generating a string of keycodes corresponding to at least one common word of at least two characters.

21. A method for generating multiple distinct keycodes upon activation of keys:

Providing a keyboard having a first key, a second key, and a third key, where the first key corresponds to a word separator character;

Detecting a sequence of a first, a second, and a third strike in succession upon the keys of the keyboard, the first strike being a strike upon the first key;

Generating a first keycode corresponding to a word separator character;

Generating a second keycode corresponding to a lower case alphabetic character and a third keycode differing from the second keycode if the second strike is a strike upon the second key and the third strike is upon the third key; and Inhibiting production of the second keycode and Generating a fourth keycode corresponding to an upper case alphabetic character if the second strike is a strike upon the second key and the third strike is upon the second key.

22. A method for generating multiple distinct keycodes upon activation of keys:

Providing a keyboard having a first key, and a second key;

Detecting a sequence of a strike upon the first key;

Checking for sideways pressure on the second key in a first direction; and

Generating a first keycode if the second key has sideways pressure in the first direction, and generating a second keycode if the second key has no sideways pressure in the first direction.

23. The method of claim 22, wherein the second key is a spacebar.

* * * * *